(12) United States Patent
Massingill et al.

(10) Patent No.: US 6,271,107 B1
(45) Date of Patent: Aug. 7, 2001

(54) SEMICONDUCTOR WITH POLYMERIC LAYER

(75) Inventors: Thomas Massingill, Scotts Valley; Mark Thomas McCormack; Hunt Hang Jiang, both of San Jose, all of CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/282,788

(22) Filed: Mar. 31, 1999

(51) Int. Cl.⁷ .................................................. H01L 21/44
(52) U.S. Cl. ......................... 438/597; 438/612; 438/455
(58) Field of Search ........................... 438/597, 612–617, 438/455–459

(56) References Cited

U.S. PATENT DOCUMENTS

| | | |
|---|---|---|
| 4,928,387 | 5/1990 | Mather et al. . |
| 4,961,165 | 10/1990 | Ema . |
| 5,094,919 | 3/1992 | Yamada et al. . |
| 5,384,952 | 1/1995 | Matsui . |
| 5,406,459 | 4/1995 | Tsukamoto et al. . |
| 5,641,946 | 6/1997 | Shim . |
| 5,658,827 | 8/1997 | Aulicino et al. . |
| 5,672,542 | 9/1997 | Schwiebert et al. . |
| 5,789,271 | * 8/1998 | Akram ................................ 438/613 |
| 5,834,366 | * 11/1998 | Akram ................................ 438/614 |
| 5,844,782 | 12/1998 | Fukasawa . |
| 5,848,467 | 12/1998 | Khandros et al. . |
| 5,877,078 | 3/1999 | Yanagida . |
| 5,885,891 | * 3/1999 | Miyata et al. ........................ 438/612 |

* cited by examiner

Primary Examiner—David Nelms
Assistant Examiner—Dung A Le
(74) Attorney, Agent, or Firm—Coudert Brothers

(57) ABSTRACT

Bumped semiconductor substrates and methods for forming bumped semiconductor substrates are disclosed. The bumped semiconductor substrates have a polymeric layer, which can serve as a passivation layer for chips derived from the semiconductor substrate.

33 Claims, 3 Drawing Sheets

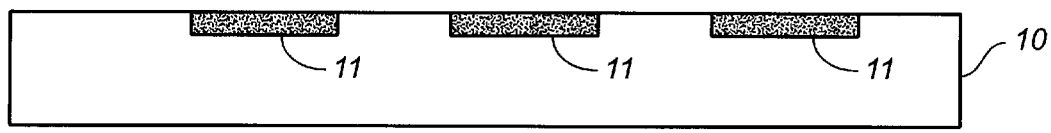
FIG._1
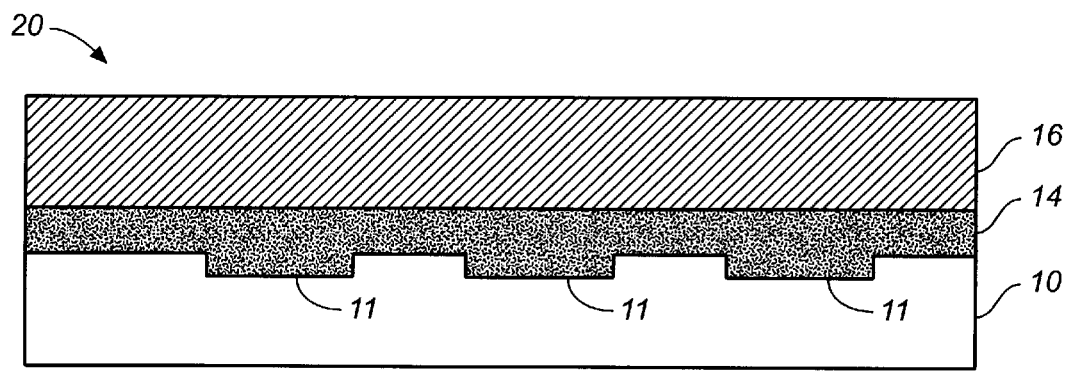
FIG._2
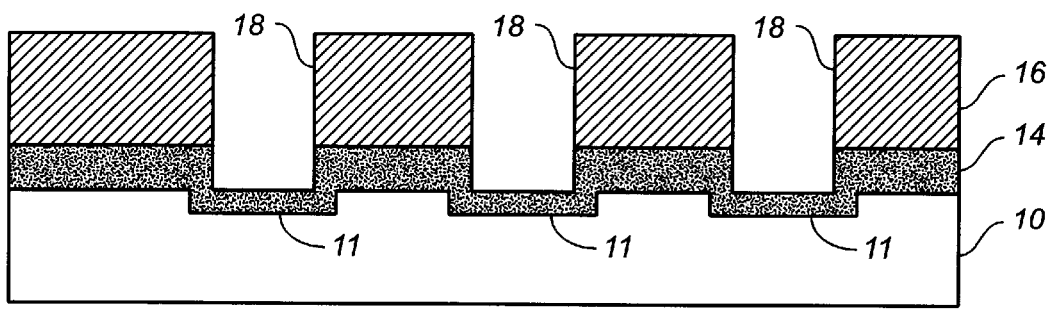
FIG._3
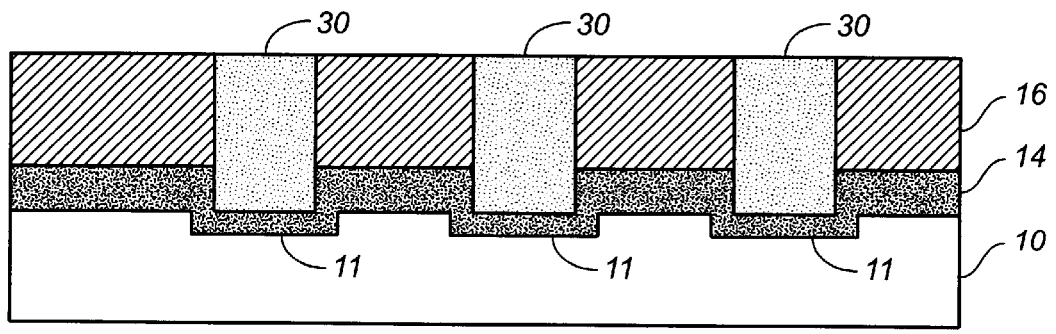
FIG._4

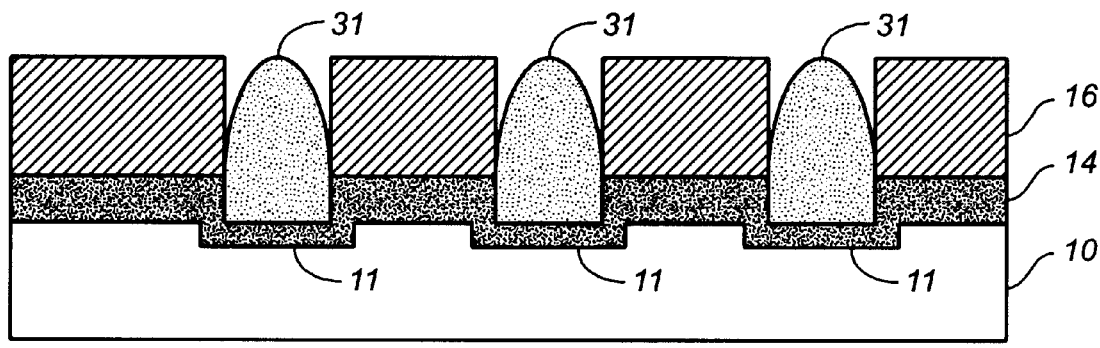
FIG._5
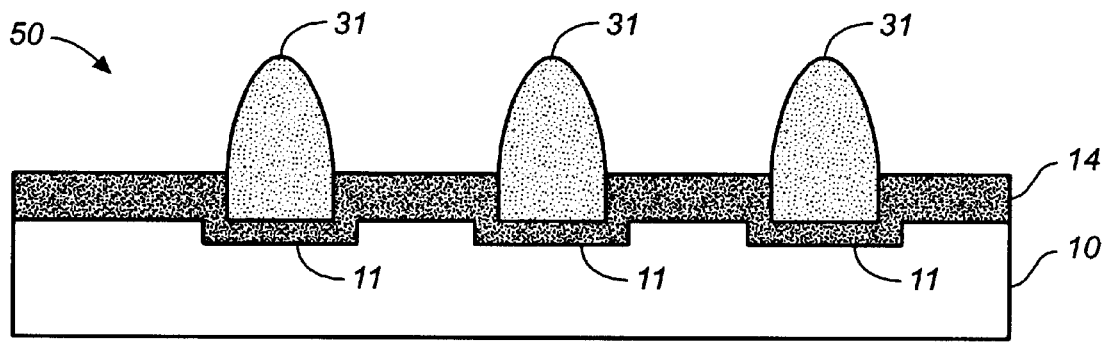
FIG._6
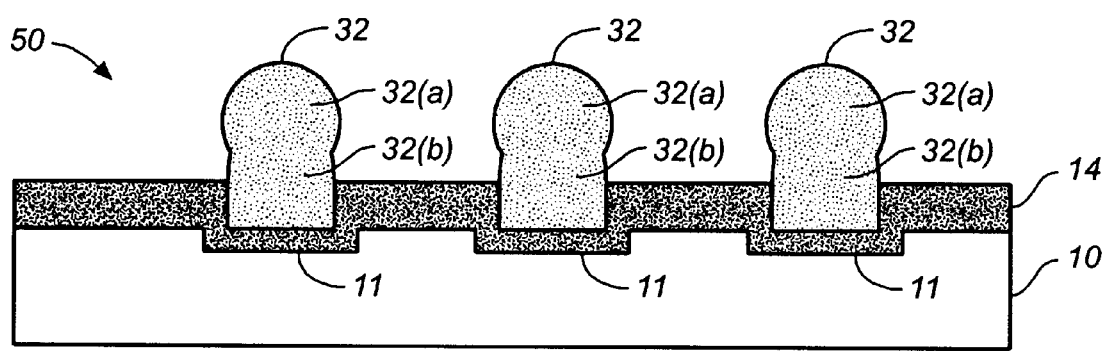
FIG._7

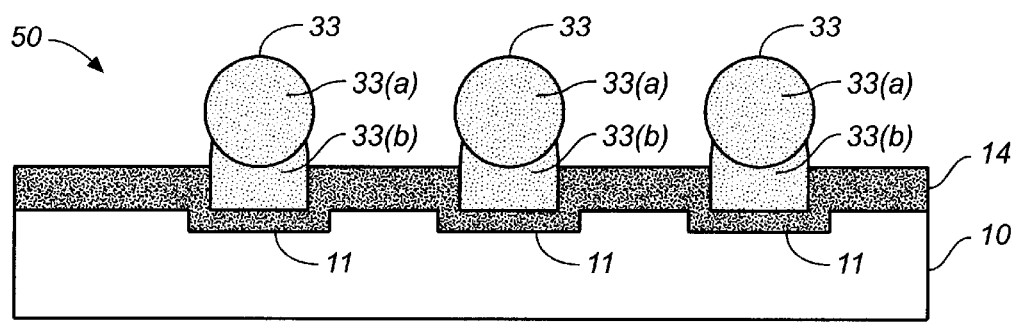
FIG._8
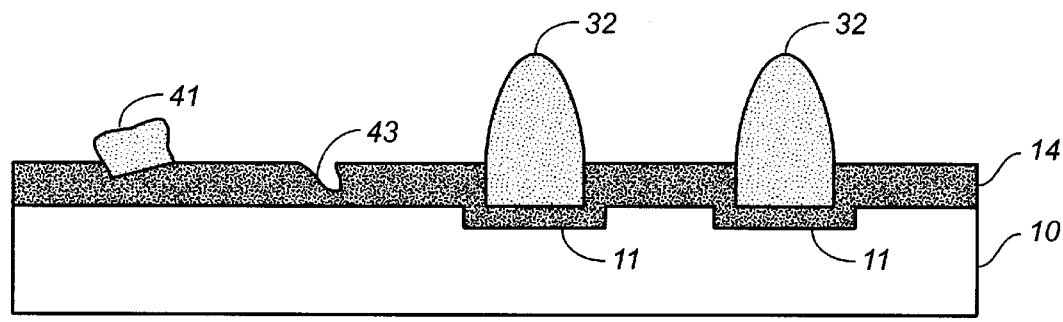
FIG._9
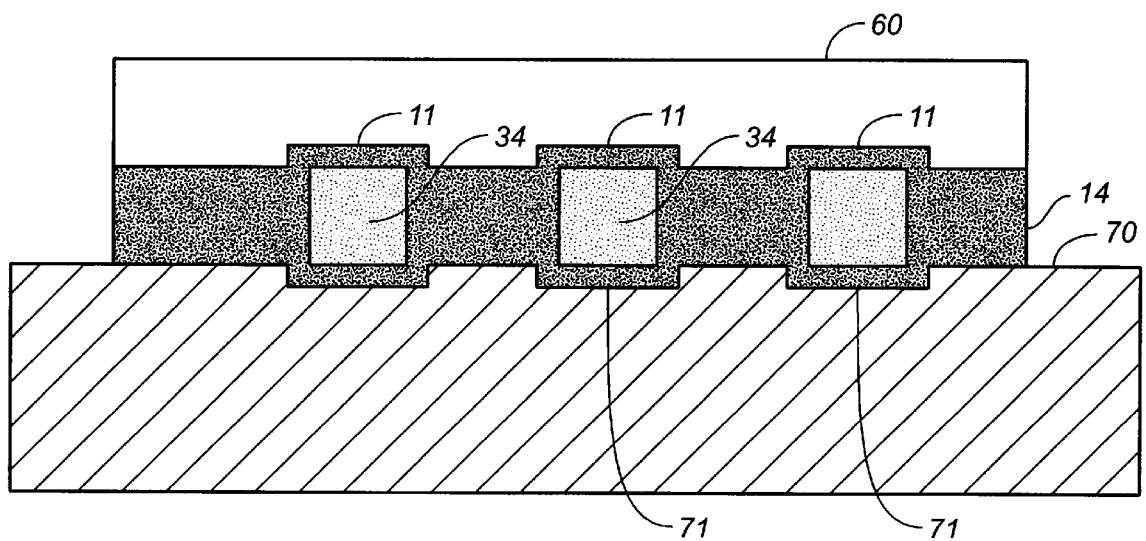
FIG._10

SEMICONDUCTOR WITH POLYMERIC LAYER

FIELD OF THE INVENTION

The invention relates to methods and structures for processing a semiconductor substrate into a semiconductor device having a polymeric layer.

BACKGROUND OF THE INVENTION

Flip chip bonding processes are very popular for communicating a chip to a circuit substrate such as circuit board. In an exemplary flip chip bonding process, plural solder bumps are formed on the semiconductor chip so that the bumps are on the face of the chip. The bumped chip is then flipped over and is mounted on the circuit substrate so that the bumps contact conductive pads on the circuit substrate. The solder bumps are then heated so that the solder bumps form solder joints coupled to the pads, thus communicating the chip to the circuit substrate.

Flip chip bonded chips have a number of advantages over other chip connection processes such as wire bonding. For example, the circuit substrate in a wire bonded assembly typically has pads in a ring-like pattern, and a chip is secured within the ring-like pattern in a face up position. Fine wires connect the pads on the circuit substrate to pads located at the periphery of the upward facing face of the chip. In assemblies such as these, the number of input/output (I/O) connections between the chip and the substrate are limited and the space occupied by the wires is relatively large.

On the other hand, flip chip bonded chips communicate with an underlying circuit substrate without the use of an intermediate conducting structure such as a bonding wire. Consequently, shorter signal paths exist between the chip and the circuit substrate in a flip chip assembly than in an assembly such as a wire bonded assembly. Moreover, since flip chip bonded chips do not require intermediate conducting structures such as bonding wires to communicate the chip and the circuit substrate, the materials and processing steps used in the electrical assembly are reduced. Reducing the materials and processing steps significantly reduces the cost of the electrical assembly. In addition, in a flip chip assembly, the I/O connections are not limited to the peripheral region of the chip face, as is the case in a typical wire bonded assembly. In a flip chip assembly, I/O connections (e.g., solder joints) may be present across the face of the chip. The increased number of I/O connections between the chip and the circuit substrate in a flip chip assembly provides more signal pathways between the chip and the circuit substrate.

Although flip chip bonding provides a number of advantages, flip chip bonding also presents a number of problems. For example, stenciling can be used to form solder bumps on chips to be flip chip bonded. In a typical stenciling process, a rigid stencil is placed on a semiconductor wafer having a number of chips. The stencil is disposed over the wafer so that the apertures of the stencil are aligned with pads on the individual chips. Solder paste is then deposited through the stencil apertures and onto the pads. The deposited solder is then reflowed to form solder bumps on the wafer. After reflow, the stencil is separated from the wafer. When the mask is separated from the wafer, the stencil may inadvertently contact one or more of the solder bumps dislodging them from the wafer. If this occurs, it may be necessary to rework the wafer to maximize the yield of bumped chips. Reworking wafers is expensive and time consuming. Although conventional photoimageable and strippable solder masks can be used in place of the rigid stencil described above, the use of solder masks requires additional process steps which increases the cost of the formed electrical assembly.

Also, even though a flip chip can advantageously have a large number of solder joints on the face of the chip, the increased number of solder joints creates other problems. For example, lead containing solder can emit alpha particles, which can pass into a chip to which the solder is bonded. The absorbed alpha particles can cause cells in the chip to flip states, thereby causing a memory error in the chip. Errors such as these are known as "soft errors", and tend to increase as chip features become smaller and as the number of solder joints increase.

Furthermore, solder joints are generally inflexible. During operation, a chip in a chip assembly heats and cools as it is turned on and off. Since the chip and the circuit substrate are typically made of dissimilar materials which have different thermal expansion properties, the chip and the circuit substrate can move with respect to each other. This relative movement deforms the solder joints and places them under mechanical stress. The stress, when repeatedly applied to the joints with repeated operation of the chip, can result in breakage of the solder joints over time. Accordingly, the likelihood of solder joint breakage is more likely in a flip chip assembly than in, e.g., a wire bonded chip assembly, because the number of solder joints on the chip are significantly greater in a flip chip assembly than in a wire bonded chip assembly.

It would be desirable to provide methods and structures which can improve the reliability of an electrical assembly having flip chips, while also reducing the steps and materials used to form an electrical assembly having flip chips.

SUMMARY OF THE INVENTION

One embodiment of the invention relates to a method for processing a semiconductor substrate. The method includes forming a laminate comprising a semiconductor substrate having a conductive region, a polymeric layer, and a release layer, where the polymeric layer is disposed between the semiconductor substrate and the release layer. An aperture is formed in the polymeric layer and the release layer to expose the conductive region, and a solder composition is deposited within the aperture. While in the aperture, the solder composition is reflowed to form a solder bump. After the solder bump is formed, the release layer is separated from the polymeric layer.

Another embodiment of the invention can be directed to a bumped semiconductor substrate. The bumped semiconductor substrate includes a semiconductor substrate having a conductive region, a polymeric layer on the semiconductor substrate; and a release layer on the polymeric layer. The polymeric layer and the release layer have a common aperture disposed over the conductive region, and the common aperture includes a solder bump electrically coupled to the conductive region.

Other embodiments of the invention relate to methods for forming electrical assemblies such as multichip modules and chip scale packages.

These and other embodiments of the invention will become apparent to those skilled in the art from the following detailed description, the accompanying drawings, and the appended claims.

BRIEF DESCRIPTION OF THE DRAWINGS

FIGS. 1 to 6 illustrate cross sections of structures used to form bumped semiconductor substrates according to embodiments of the invention.

FIGS. 7 to 9 show cross sections of bumped semiconductor substrates according to embodiments of the invention.

FIG. 10 shows a cross section of an electrical assembly formed in accordance with embodiments of the invention.

The embodiments shown and described with reference to the FIGS. are for illustration purposes, and are not intended to be limiting. For clarity of illustration, some features in the Figures may not be to scale.

DETAILED DESCRIPTION

Embodiments of the invention can be described with reference to FIGS. 1 to 6. FIGS. 1 to 6 illustrate an exemplary way of forming solder bumps on a semiconductor substrate.

In embodiments of the invention, a laminate such as the laminate 20 shown in FIG. 2 can be formed. The laminate 20 includes a semiconductor substrate 10 having a plurality of conductive regions 11, a release layer 16, and a polymeric layer 14 between the substrate 10 and the release layer 16.

FIG. 1 shows a cross-section of a semiconductor substrate 10 to be processed. In preferred embodiments, the semiconductor substrate 10 is a semiconductor wafer (e.g., Si, GaAs) comprising a plurality of integrated circuit chips. In these embodiments, the conductive regions can be conductive pads on the individual integrated circuit chips. The wafer can be diced at a later time (e.g., after forming solder bumps on the wafer) to separate the integrated circuit chips so that they can be mounted or packaged in a desired manner. In other embodiments, the semiconductor substrate 10 can be a unitary semiconductor device which is not intended to be diced.

The conductive regions 11 can be made of any suitable conductive material, and can be in the form of a single layer or multiple layers. For example, the conductive regions 11 can include a single layer of a metal such as Cu, Al, Ag, Au, Pd, Pt, and alloys thereof. If desired, the conductive regions 11 can include multiple layers. For example, the conductive regions 11 may comprise a layer of conductive material (e.g., a metal such as Al or Cu) coated with one or more layers of any suitable conductive material including metallic materials such as brass, bronze, Zn, Ni, Sn, Cd, Bi, Au, In, Pd, Ag, solder, alloys, and combinations thereof. The conductive regions can also include underbump metallurgy (UBM) formations such as Ti/Ni/Au and AlW/Cu. Regardless of the number of layers in the conductive regions 11, the exposed surface of the conductive regions 11 (i.e., the surface to be contacted by the deposited solder) preferably includes a solderable material such as Cu, Ni, Ag, Au, Sn, Pd, and combinations thereof. More preferably, the solderable metal is a diffusion barrier metal such as Ni or Pd.

In the laminate 20, the polymeric layer 14 has adhesive properties, and can be thermosetting or thermoplastic. The polymeric layer 14 can also have elastomeric properties. Suitable polymeric materials include epoxy functional polymers, polyimides, liquid crystal polymers, cycloolefins, polyurethanes, polyamides, benzocyclobutanes, polyamide-imides, polyarylene ether, benzimidazoles, polyetherketones, polysiloxanes, polyetheretherketones, polyphenylquinozalines, polyimide iso-indoloquinazolinediones, fluoropolymers, cyanate esters, bismaleimide triazine (BT), cynate ester, and combinations thereof.

Preferably, the polymeric layer 14 is thermosetting. If the polymeric layer is thermosetting, the polymeric layer may be tacky when uncured, but non-tacky when cured. In addition, the polymeric layer 14 can be cured at any suitable time. Preferably, the polymeric layer 14 is cured before the apertures 18 (shown in FIG. 3) in the release layer 16 and the polymeric layer 14 are formed.

The polymeric layer 14 can be a single layer or can have any suitable number of sublayers of the same or different composition. For example, the polymeric layer can include a rigid core or thermally stable flexible core coated with one or two polymeric sublayers. The polymeric layer 14, or one or more sublayers of the polymeric layer 14, can have any suitable thickness. For example, the polymeric layer 14, or one or more sublayers of the polymeric layer 14, can have a thickness greater than about 10 μm. Preferably, the thickness of the polymeric layer 14 is at least about 75 μm. Such thicknesses are suitable for protecting integrated circuits in the wafer from alpha particles emitted by the solder bumps or subsequently formed solder joints. The polymeric layer more preferably has a thickness between about 100 μm and about 200 μm or more. Such thicknessness can be especially suitable for producing an electrical assembly such as a chip scale package.

In the laminate 20, the release layer 16 is releasably adhered to the polymeric layer 14. That is, the adhesive force between the polymeric layer 14 and the release layer 16 can be such that a person or machine can peel the release layer 16 from the polymeric layer 14 without significantly disrupting the physical disposition of the polymeric layer 14.

The release layer 16 can include any suitable thickness, including a thickness of about 7.5 μm or more. In some embodiments, the release layer has a thickness between about 7.5 μm and about 200 μm, and preferably between about 50 μm and about 100 μm. In other embodiments, the release layer can have a thickness of about 500 μm or more. Release layers having a thickness greater than about 500 μm can be used when, e.g., a chip scale package is to be formed from the subsequently formed bumped semiconductor substrate. The release layer assists in producing high aspect ratio solder bumps which can provide for increased standoff between, e.g., a chip and a circuit substrate in an electrical assembly. The benefits of providing increased standoff are described in further detail below.

The release layer can be made of any suitable material. For example, the release layer 16 can include a metallic or a polymeric material which does not melt at the reflow temperature of the solder particles used to form the solder bump. In this regard, the release layer 16 can have a melting point greater than about 250° C., or more preferably greater than about 350° C. or even greater than about 450° C. Preferably, the release layer is a thermally stable material such as polytetrafluoroethylene (Teflon™), polyimide, or metal.

The laminate 20 shown in FIG. 2 can be formed in any suitable manner. For example, the polymeric layer 14 can be preformed before adhering to the semiconductor substrate 10. Suitable preformed polymer layers include what are sometimes known as "bonding sheets". Suitable commercially available bonding sheets include Nippon Steel SPB, DuPont Kapton™ KJ and Kapton™ EKJ, Nitto-Denko PFM, Mitsubishi GMPL, and Ajinomoto ABF.

In some embodiments, a preformed polymeric layer can be laminated to the semiconductor substrate 10. Illustratively, composites comprising an adhesive polymeric layer sandwiched between two release layers can be obtained. One of the release layers can be separated from the adhesive polymeric layer thus exposing an adhesive surface of the adhesive polymeric layer. Then, the adhesive polymeric layer/release layer composite can be tack laminated to the semiconductor substrate 10. During tack laminating, heat and pressure softens the resin in the adhesive polymeric layer, thus permitting the polymeric layer 14 to adhere to the semiconductor substrate 10. Preferably, tack laminating is performed at low pressures (e.g., about 15 psi to about 100 psi) under vacuum. When the release layer/polymeric layer 16, 14 composite is laminated on the semiconductor substrate 10, the release layer 16 can advantageously prevent the polymeric layer 14 from adhering to the dies of a lamination press. This is because the outer surface of the release layer 16 may be substantially non-adhesive. After tack laminating, the previously exposed adhesive surface of the polymeric layer 14 contacts the surface of the semiconductor substrate and the unseparated release layer 16 is on top of the polymeric layer 14, thus forming the laminate 20.

If desired, the release layer 16 on top of the polymeric layer 14 can be replaced with a different release layer. For example, a release layer/polymeric layer composite 16, 14 can be laminated to the semiconductor substrate 10. After the polymeric layer contacts and adheres to the semiconductor substrate, the release layer 16 can be separated (e.g., by peeling) from the polymeric layer leaving an exposed adhesive surface. A more desirable release layer can then be laminated on the exposed adhesive surface of the polymeric layer to form the laminate 20. Replacement of the release layer may be desirable if a release layer having different properties is desired. For example, it may be desirable to replace a release layer having a low melting point with a release layer having a higher melting point.

In other embodiments, the preformed polymeric layer and the release layer can be laminated onto the semiconductor substrate simultaneously. For example, a desired polymeric layer and a desired release layer can be placed on a semiconductor substrate. This combination can then be laminated together by pressing the combination with heated platens or passing the combination through a pair of laminating rollers, thus forming the laminate 20.

The polymeric layer 14 can also be formed on the semiconductor substrate 10 instead of being preformed. This can be done in any suitable manner including screen printing, spray coating, or curtain coating a layer of liquid adhesive polymeric material on the surface of the semiconductor substrate 10. After the liquid polymeric layer is deposited on the semiconductor substrate 10, the liquid polymeric layer can be soft baked to remove solvents therefrom. If a solvent is present in the liquid adhesive, soft baking increases the removal rate of the solvent from the liquid adhesive by vaporizing the solvent thus causing it to separate from the liquid adhesive. The liquid polymeric layer can be heated to a temperature above room temperature (25 ° C.) for about one minute or more without significantly diminishing the adhesive properties of the material. After forming the adhesive polymeric layer, a release layer can be laminated to the polymeric layer.

If the release layer 16 is not preformed, the release layer 16 may be formed on the polymeric layer 14 in any suitable manner. This can be done prior to, or after, the polymeric layer 14 is on the semiconductor substrate 10. For example, the release layer 16 can be formed on the polymeric layer 14 by vapor depositing a continuous or discontinuous layer of metallic or polymeric material on the polymeric layer 14.

With reference to FIG. 3, after the laminate 20 is formed, one or more apertures 18 are formed in the polymeric layer 14 and the release layer 16 to expose one or more conductive regions 11 on the semiconductor substrate 10. Each aperture 18 can have a diameter of about 25 $\mu$m or more. Preferably, the formed apertures 18 may have diameters in the range of from about 25 $\mu$m to about 500 $\mu$m, and more preferably from about 50 $\mu$m to about 250 $\mu$m. In embodiments of the invention, the minimum aperture diameter is at least about three times the maximum particle size of the solder particles subsequently deposited in the apertures. For example, the minimum diameter for the apertures shown in FIG. 3 can be about 50 $\mu$m or more for solder particles having maximum diameters of about 15 $\mu$m.

The apertures 18 can be formed by any suitable method. Preferably, the apertures 18 are formed by laser drilling the polymeric layer/release layer composite 14, 16 while they are disposed on the semiconductor substrate 10. By doing so, the apertures 18 formed in the polymeric layer 14 and release layer 16 are self-aligned with respect to each other and the conductive regions 11 on the semiconductor substrate 10. Any suitable laser can be used for this purpose. For example, a YAG-UV laser, Excimer laser, or $CO_2$ laser may be used to form the apertures 18. A YAG-UV laser is desirable because it provides a higher yield of defect-free drilled apertures, and because apertures formed with a YAG-UV laser typically do not need cleaning. If desired, a lasing sheet may be placed on top of the release layer 16 to facilitate the laser drilling operation. A lasing sheet promotes beneficial heat distribution for the laser drilling, thus providing more precise hole drilling. Suitable lasing sheets can be obtained from Mitsubishi Chemical, Inc.

The apertures 18 can be formed one at a time with a laser, or many apertures 18 can be formed substantially simultaneously with a laser. For example, in a wide area laser ablation process, a laser drill mask (e.g., a discontinuous layer of Cr or Ti having a thickness of about 1 micron or more) can be formed or placed on the release layer 16. Then, a laser can irradiate and subsequently ablate portions of the release layer 16 and the polymeric layer 14 exposed through the apertures of the laser mask to substantially simultaneously to form plural apertures 18. In this instance, a $CO_2$ laser is preferably used to ablate portions of the release layer 16 and the polymeric layer 14 in order to form plural apertures 18 substantially simultaneously. After laser drilling, the laser mask can be removed.

The presence of the release layer 16 on the polymeric layer 14 protects the underlying polymeric layer's upper surface from being contaminated with byproducts from the laser drilling process. If the polymeric layer 14 is to be used as an underfill between a chip and a circuit substrate, contaminants on the subsequently exposed adhesive surface of the polymeric layer can prevent the polymeric layer from adhering to the circuit substrate. For example, ash products can be produced when the polymeric layer is laser drilled to form apertures. If the ash products deposit on the exposed adhesive surface of the polymeric layer, the ash products can be disposed between this surface and the surface of the circuit substrate consequently inhibiting bonding between the chip and the circuit substrate.

In alternative embodiments, the apertures 18 can also be formed in the polymeric layer 14 and the release layer 16 by using dry or wet etch methods. For example, in some embodiments, a layer of photoresist can be deposited on the release layer 16. The photoresist layer can then be patterned and developed to expose portions of the release layer 16 above the conductive regions 11 on the semiconductor substrate 10. Then, the exposed portions of the release layer 16 can be etched along with corresponding portions of the adjacent polymeric layer 14 to form apertures 18 which expose the conductive regions 11. In other embodiments, the release layer 16 and the polymeric layer 14 may be photosensitive so that both layers may be pattern exposed to radiation, and then developed to form plural apertures 18.

After forming the apertures 18, the apertures 18 can be cleaned to remove any unwanted residue therein. Any suitable cleaning method can be used including a plasma cleaning operation or a wet cleaning process.

As shown in FIG. 4, after the apertures 18 are formed in the polymeric layer 14 and the release layer 16 above the conductive regions 11 of the semiconductor substrate 10, a solder composition 30 can be deposited into the apertures 18 and onto the conductive regions 11. Preferably, the solder composition is in the form of a slurry. Regardless of how the solder composition is deposited, the solder composition can be deposited within the apertures 18 and on the conductive regions 11 while the release layer 16 is still in place.

Any solder composition suitable for forming a solder bump can be deposited into the apertures. Preferably, the solder composition includes solder particles comprising lead or tin alloys. Suitable examples of such alloys include Sn—Ag (e.g., Sn96.5:Ag3.5) and Sn—Pb (e.g., 63Sn:37Pb) alloys. The solder composition can include a carrier (e.g., a fluxing carrier) and can optionally include other suitable additives. The carrier can include one or more of a resin, solvent, a hardener, and a fluxing agent.

If the solder composition is in the form of a slurry, the slurry can be deposited within the apertures 18 by any suitable method including stenciling. Stenciling includes passing a blade such as a doctor blade over the surface of the release layer 16 with the slurry disposed along the leading edge of the blade. As the slurry passes across the surface of the release layer 16, some of the slurry 20 deposits into the apertures 18. Some slurry residue may remain on the outer surface of the release layer 16 after the stenciling procedure. The apertured release layer 16 acts as a stencil, thus controlling the amount of slurry deposited within the apertures of the polymeric layer 14.

Using a release layer as a stencil to deposit a slurry within the apertures provides several benefits. First, the release layer 16 protects the bonding surface of the polymeric layer 14 during the deposition of the slurry, thus preventing the slurry from contaminating the bonding surface of the polymeric layer. As explained previously, if the polymeric layer is to be used as an underfill material, contaminants present on the bonding surface of the polymeric layer can prevent the polymeric layer from adequately adhering to an adjacent circuit board. Second, in conventional stenciling processes, there is the potential for misalignment of the stencil during processing. For this reason, the diameter of stencil apertures are normally smaller than the diameter of the apertures in which the solder composition is deposited. However, in embodiments of the invention, the apertures in the release layer 16 are virtually perfectly aligned with, and have substantially the same diameter as, the underlying apertures in the polymeric layer 14. Therefore, the minimum diameter of the polymeric layer apertures are not limited by the dimensions of the release layer apertures as would be the case with a removable stencil. The use of a release layer therefore enables the formation of smaller diameter and more densely packed solder bumps. Third, the release layer 16 can be at least 12.5 μm thinner than the thinnest stencil currently available (25 μm). Thinner stencils can be used to deposit the slurry into smaller apertures, which can result in the formation of smaller solder bumps. Fourth, the release layer 16 conforms to any non-planarities on the surface of a polymeric layer caused by the unevenness on the surface of the semiconductor substrate better than a conventional stencil. This reduces the variation in the amount of solder composition that is stenciled into the plurality of apertures 18. As a result, more uniform filling and better controllability are achieved with release layer 16, which are important factors for reliably forming high densities of small solder bumps. Fifth, conventional stencils are often used several times and tend to collect contaminants on their surfaces which can be later transferred to polymeric layer 14. As stated above, contaminants on the bonding surface of the polymeric layer 14 may prevent the tacky surface of the polymeric layer 14 from adhering to an adjacent surface.

Stenciling a solder composition within the apertures of a dielectric layer (e.g., a polymeric layer) to form solder bumps also provides many advantages over methods such as electroplating and sputtering. For example, stenciling is considerably faster, less expensive, and easier to practice than methods such as sputtering and electroplating. In addition, methods such as sputtering and electroplating typically require additional etchback or planarization steps to remove excess material. Such steps are not required in embodiments of the invention. Furthermore, many desirable solder compositions which can be stenciled cannot be patterned by methods such as plating or evaporation. Moreover, when stenciling, a slurry can be deposited into polymeric layer apertures having different sizes. Consequently, solder bumps having different sizes can be made in the polymeric layer. In comparison, it is difficult to reliably form solder bumps having different sizes with electroplating. For example, different-sized apertures in a polymeric layer respectively require different current densities to plate the apertures full, with solder to uniform heights. This cannot readily be achieved with an electroplating bath, because electroplating baths have relatively uniform current density throughout the bath.

With reference to FIG. 5, after depositing the solder composition 30 in the apertures 18, the solder composition 30 can be reflowed. Upon reflow, the solder particles in the solder composition 30 melt and coalesce together and substantially eliminate the interstices previously present between the solder particles. The surface tension of the coalescing solder particles in the solder composition causes the coalescing solder particles to form solder bumps 31.

The deposits of solder composition can be reflowed any suitable number of times. For example, the solder composition 30 can be reflowed in a first reflow step for a first period of time within the apertures 18 to form solder bumps 31. As the solder particles in the composition melt and flow, the sidewalls of the apertures 18 in the polymeric layer 14 and the release layer 16 constrain the reflowing solder composition. The exposed end of the solder composition 30 of the formed solder bumps, however, can flow unconstrained. The surface tension of the reflowing solder at the exposed end of the forming bump causes the exposed end of the bump to curve (e.g, form a cone or have a cone-shape). Consequently, the formed solder bump can have generally straight side portions and a curved end which is exposed. The exposed end can be disposed opposite the conductive region 11 upon which the bump is disposed.

Having an apertured release layer present on the polymeric layer during the reflow of the solder composition provides a number of advantages. First, the release layer can separate adjacent reflowing solder composition deposits, thus decreasing the likelihood that adjacent deposits will join together during reflow, thus creating a short-circuit. Second, the presence of the apertured release layer on the polymeric layer during the deposition of the solder composition in the apertures and during reflow permits more solder to be incorporated into the formed solder bump. For example, with reference to FIG. 4, the apertures of the release layer 16 confine an amount of slurry above the corresponding apertures in the underlying polymeric layer 14. This amount of slurry is substantially equal to the volume determined by the average cross-sectional area of the individual apertures in the release layer 16 times the thickness of the release layer 16. During reflow, the coalescing solder particles melt and coalesce together to form a solder bump. The non-metal constituents of the slurry can volatilize and separate from the formed solder bump.

After forming the solder bumps 31, the release layer 16 can be separated from the polymeric layer 14 by, e.g., peeling. Excess slurry or reflowed slurry from the stenciling process still remaining on the top surface of the release layer 16 can be removed from the resulting structure along with the release layer 16 by separating the release layer 16 from the polymeric layer 14. This exposes the upper surface of the polymeric layer 14. After separating the release layer 16 from the polymeric layer 14, a bumped semiconductor substrate having a polymeric layer 50 such as the some shown in FIG. 6 is formed. As shown in FIG. 6, the height or length of the solder bumps 31 can be greater than the thickness of the polymeric layer 14.

If desired, the solder bumps 31 can be reflowed a second time in a second reflow step to form reformed solder bumps 32. The second reflow can take place after separating the release layer 16 from the polymeric layer 14. During the second reflow, the upper portion of the previously formed solder bump can flow and reform without being constrained by the aperture walls of the release layer. The surface tension in the solder at the upper portions of the bump flow unconstrained and form a generally spherical head portion. As shown in FIG. 7, after the second reflow, the reformed solder bumps 32 can each have a head portion 32 and a columnar portion 32(b). The columnar portion 32(b) can be disposed within the apertures of the polymeric layer 14.

Reflowing formed solder bumps a second time to form reformed solder bumps allows accurate measurement of the height of the reformed solder bumps. The final height of the reformed solder bump is above the polymeric layer, and is affected by the thickness of the release layer and the diameter of the aperture in the release layer. Due to process variations, the diameter of the apertures in the polymeric layer and the release layer may vary. Height measurements performed on the reformed solder bumps (i.e., after separating the release layer and after the second reflow step) more accurately shows process variations. Accurate characterization of solder bumps can help ensure that the formed solder bumps are within process control limits.

After forming or reforming the solder bumps, the solder bumps can be optionally fluxed or cleaned. The bumps can be cleaned with a cleaning liquid such as water or isopropyl alcohol, and/or can be fluxed with any suitable fluxing material. Alternatively, a protective layer can be deposited or formed on the bumps by a process such as sputtering, evaporation, or PADS (plasma assisted dry soldering). The cleaning operation can occur while the solder bumps are present within the apertures of the polymeric layer/release layer composite, or may be done after the release layer is separated from the polymeric layer.

The solder bumps formed in accordance with embodiments of the invention can be quite long and/or have a high aspect ratio, thus providing for an increased standoff distance between a chip and a substrate. The aspect ratio of a solder bump can be the length of the solder bump divided by the shortest cross-sectional width of the solder bump. The solder bumps made in accordance with embodiments of the invention can have an aspect ratio of greater than about 2, and preferably greater than about 3. This is in comparison to traditional methods where the formed solder bumps have an aspect ratio of around one.

Solder bumps with high aspect ratios can provide for an increased standoff distance between the chip and a circuit substrate. Increased standoff distances are highly desirable. For example, increasing the standoff distance improves the fatigue life of a solder joint. Solder joint fatigue is caused in part by the temperature cycling of the chip and the large difference between the thermal expansion properties of the closely spaced chip and circuit substrate. The increased space between the chip and the underlying circuit substrate can permit the chip to move more freely in response to thermal cycling than if the chip was closer to the circuit substrate. Consequently, solder joint fatigue is reduced and the likelihood of breaking a solder joint is reduced if the standoff distance is increased.

Conventionally, the standoff distance between a chip and a circuit substrate is increased by using solder balls with large diameters to form solder joints. However, the use of large solder balls alone can increase the pitch of the formed solder joints and consequently decreases the density of I/O connections between the chip and the circuit substrate. However, in embodiments of the invention, the standoff height can be increased without increasing the pitch. For example, in embodiments of the invention the average pitch of solder bumps can be less than about 150 $\mu$m, while providing a stand off distance of at least about 150 $\mu$m.

The standoff distance can be increased even further in other embodiments of the invention. For example, with reference to FIG. 8, solder balls can be bonded to, or formed on, solder bumps formed in accordance with other embodiments of the invention (e.g., the bumps 32 as shown in FIG. 6) to form even larger solder bumps 33. The formed solder bumps 33 can have a head portion 33(a) and a columnar portion 33(b), where the head portion 33(a) is disposed opposite a corresponding pad 11 on the semiconductor substrate 10. The columnar portion 33(b) may have curved sides or straight sides, while the head portion 33(a) can be substantially spherical. By providing solder bumps 33 such as these, the standoff distance can be increased even more.

The solder balls joined to the ends of the solder bumps can have any suitable diameter including a diameter greater than about 25 $\mu$m. The subsequently formed head portions 33(a) of the solder bumps 33 can have similar dimensions to the solder balls. For chip scale package applications in particular, the solder balls preferably have a diameter between about 200 $\mu$m and about 400 $\mu$m. For flip chip applications, the solder balls preferably have a diameter less than or about equal to one half the pitch. For example, the solder balls can have a diameter of about 75 $\mu$m while being at a pitch of about 150 $\mu$m.

The solder balls can be bonded to the formed solder bumps in any suitable manner to form larger solder bumps. For example, in embodiments of the invention, preformed solder balls can be placed on, and then melt-bonded to the exposed ends of the formed solder bumps. In other embodiments, the solder balls can be formed on the exposed ends of the solder bumps to form larger solder bumps. For example, a slurry containing a solder composition can be stenciled onto the ends of the formed solder bumps. Then, the stenciled solder composition can be reflowed to form solder balls at the exposed ends of the solder bumps.

As stated previously, after separating the release layer 16 from the polymeric layer 14, a bumped semiconductor substrate having a polymeric layer 50 like the ones shown in FIGS. 6 to 8 can be formed. If the semiconductor substrate 10 is a unitary device, the bumped semiconductor substrate can be flipped over and mounted on an appropriate circuit substrate (not shown)

Preferably, the semiconductor substrate 10 includes a number of integrated circuit chips separated by scribe lines. The semiconductor substrate 10 and the polymeric layer disposed on the semiconductor substrate 10 can be cut (e.g., diced) with any suitable device (e.g., saw, laser) along the scribe lines to separate the chips. Each individual chip can have solder bumps and a discontinuous polymeric layer disposed around the bumps. Since the polymeric layer is cut along with the semiconductor substrate, portions of the polymeric layer formed by the cutting can have substantially the same planar dimensions as the separated chips. After separating the bumped chips from each other, the bumped chips can be flipped over and then mounted to the conductive regions (e.g., pads) of a circuit substrate to couple the chips to the substrate. Plural solder joints can be formed from the solder bumps to bond the chip to the circuit substrate consequently forming an electrical assembly such as a multichip module or a chip scale package. Suitable circuit substrates include flex circuit boards, rigid circuit boards, etc. If the polymeric layer has substantially the same thickness as the formed solder bumps, the polymeric layer may serve as an underfill material as well as an alpha particle barrier. In other embodiments, a space may be present between the polymeric layer and the circuit substrate in the formed electrical assembly.

The polymeric layer 14 provides several benefits to a formed electrical assembly. For example, in an electrical assembly, the polymeric layer 14 can passivate the surface of the semiconductor substrate 10 or chips derived from the semiconductor substrate 10. More specifically, the polymeric layer 14 can protect the semiconductor substrate 10, or any chips derived from the semiconductor substrate 10, from environmental conditions which can harm the chip including humidity, physical damage and debris. For example, as shown in FIG. 9, debris 41 and damage 43 due to handling, which might otherwise damage integrated circuits in the semiconductor substrate 10, can be prevented by the polymeric layer 14. The polymeric layer 14 can also be a barrier to alpha particles emitted by the formed solder joints. For example, the polymeric layer 14 can intercept alpha particles passing towards the integrated circuits in the semiconductor chips or semiconductor substrate thus reducing the likelihood of creating soft errors and consequently increasing the reliability of the substrate or chips.

In addition, in some embodiments, the polymeric layer 14 may additionally be used as an underfill material residing between a circuit substrate and a flip chip bonded chip. In these embodiments, the height or length of the formed solder bumps are substantially equal to the thickness of the formed the polymeric layer. The presence of an underfill material in the formed electrical assembly can increase the fatigue life of the formed solder joints by stabilizing the joints. Further, the stability of the electrical assembly is increased because the chip can be adhesively attached to the circuit substrate.

Conventional underfill materials are deposited between the chip and the circuit substrate after the solder joints between these components are formed. The additional steps needed to add the underfill material can be time consuming and thus costly. In embodiments of the invention however, such additional steps are not required. As is apparent from the previous discussion, the polymeric layer can be placed on the semiconductor substrate having plural chips, and can be used as a stencil to help deposit a slurry onto the conductive regions of a semiconductor substrate. This stencil can be left on the separated chips and can be used as an underfill material without performing a separate underfill material deposition step. Accordingly, embodiments of the invention provide for reduced processing steps, thus lowering the overall cost of the formed assembly.

FIG. 10 shows a cross-section of an electrical assembly including a semiconductor chip 60, a polymeric layer 14, and a circuit substrate 70. The semiconductor chip 60 can be from a cut or diced semiconductor substrate having a plurality of chips. In the electrical assembly, the polymeric layer 14 is disposed between and fills the space between the chip 60 and the circuit substrate 70, when the polymeric layer 14 is used as an underfill material. The semiconductor chip 60 has conductive regions 11 confronting conductive regions 71 on the circuit substrate 70. A number of solder joints 34 formed from the previously described solder bumps are disposed between, and electrically couple the confronting conductive regions 11, 71. The polymeric layer 14 is used as an underfill material which provides stability to the formed solder joints 34 during the operation of the chip 60.

While the inventions have been particularly described with respect to particularly illustrated embodiments, it will be appreciated that various alterations, modifications and adaptations may be made based on the present disclosure, and are intended to be within the scope of the present inventions.

What is claimed is:

1. A method of processing a semiconductor substrate, the method comprising:
    forming a laminate comprising a semiconductor substrate having a conductive region, a polymeric layer, and a release layer, wherein the polymeric layer is disposed between the semiconductor substrate and the release layer;
    forming an aperture in the polymeric layer and the release layer to expose the conductive region;
    depositing a solder composition within the aperture;
    reflowing the solder composition while the solder composition is within the aperture to form a solder bump; and
    separating the release layer from the polymeric layer.

2. The method of claim 1 wherein forming an aperture comprises laser drilling the polymeric layer and the release layer to expose the conductive region.

3. The method of claim 1 wherein forming the laminate comprises laminating the polymeric layer and the release layer to the semiconductor substrate.

4. The method of claim 1 wherein the aperture includes a diameter between about 25 and about 500 microns.

5. The method of claim 1 further comprising reflowing the solder bumps to form reformed solder bumps.

6. The method of claim 1 further comprising bonding a solder ball to an exposed end of the solder bump.

7. The method of claim 1 wherein depositing a solder composition comprises stenciling the solder composition across a top surface of the release layer and into the aperture.

8. The method of claim 1 wherein the height of the solder bump is substantially equal to the thickness of the polymeric layer.

9. The method of claim 1 further comprising curing the polymeric layer.

10. The method of claim 1 wherein the polymeric layer has a thickness of at least about 75 $\mu$m.

11. The method of claim 1 wherein the solder bump has an aspect ratio of at least about 3.

12. The method of claim 1 wherein the semiconductor substrate is a semiconductor wafer comprising a plurality of chips, and wherein the method further comprises, after separating the release layer, dicing the semiconductor wafer to separate the plurality of chips.

13. A method of forming an electrical assembly comprising:
   forming a laminate comprising (i) a semiconductor substrate having plural chips and plural conductive regions, (ii) a polymeric layer, and (iii) a release layer, wherein the polymeric layer is disposed between the semiconductor substrate and the release layer;
   forming plural apertures in the polymeric layer and the release layer to expose the conductive regions;
   depositing a solder composition within the apertures;
   reflowing the solder composition while the solder composition is within the apertures to form plural solder bumps on the semiconductor substrate;
   separating the release layer from the polymeric layer;
   cutting the semiconductor substrate and the polymeric layer to separate the plurality of chips from each other, wherein at least one chip includes solder bumps and a portion of the polymeric layer disposed on a surface of the at least one chip, and the portion of the polymeric layer is disposed around the solder bumps;
   mounting the at least one chip on a circuit substrate so that solder bumps on the at least one chip are coupled to conductive regions on the circuit substrate.

14. The method of claim 13 wherein the polymeric layer has a thickness of about 75 µm or more.

15. The method of claim 13 wherein the release layer comprises polyimide.

16. The method of claim 13 wherein the electrical assembly is a chip scale package.

17. The method of claim 13 wherein the portion of the polymeric layer is an underfill material.

18. The method of claim 13 wherein the portion of the polymeric layer is a passivation layer.

19. The method of claim 13 further comprising, after mounting the at least one chip on the circuit substrate:
   forming a plurality of solder joints from the solder bumps on the at least one chip, wherein the solder joints electrically communicate the at least one chip and the circuit substrate.

20. The method of claim 13 wherein forming plural apertures in the polymeric layer and the release layer comprises laser drilling the polymeric layer and the release layer through a laser mask to form the plural apertures.

21. A method of processing a semiconductor substrate, the method comprising:
   forming a laminate comprising a semiconductor substrate having a conductive region, a polymeric layer, and a release layer, wherein the polymeric layer is disposed between the semiconductor substrate and the release layer;
   forming an aperture in the polymeric layer and the release layer to expose the conductive region, said forming an aperture comprising laser drilling the polymeric layer and the release layer to expose the conductive region;
   depositing a solder composition within the aperture;
   reflowing the solder composition while the solder composition is within the aperture to form a solder bump; and
   separating the release layer from the polymeric layer.

22. A method of processing a semiconductor substrate, the method comprising:
   forming a laminate comprising a semiconductor substrate having a conductive region, a polymeric layer, and a release layer, wherein the polymeric layer is disposed between the semiconductor substrate and the release layer;
   forming an aperture in the polymeric layer and the release layer to expose the conductive region;
   depositing a solder composition within the aperture;
   reflowing the solder composition while the solder composition is within the aperture to form a solder bump having a height which is substantially equal to the thickness of the polymeric layer; and
   separating the release layer from the polymeric layer.

23. A method of forming an electrical assembly comprising:
   forming a laminate comprising (i) a semiconductor substrate having plural chips and plural conductive regions, (ii) a polymeric layer, and (iii) a release layer, wherein the polymeric layer is disposed between the semiconductor substrate and the release layer;
   forming plural apertures in the polymeric layer and the release layer to expose the conductive regions, said forming plural apertures in the polymeric layer and the release layer comprises laser drilling the polymeric layer and the release layer through a laser mask to form the plural apertures;
   depositing a solder composition within the apertures;
   reflowing the solder composition while the solder composition is within the apertures to form plural solder bumps on the semiconductor substrate;
   separating the release layer from the polymeric layer;
   cutting the semiconductor substrate and the polymeric layer to separate the plurality of chips from each other, wherein at least one chip includes solder bumps and a portion of the polymeric layer disposed on a surface of the at least one chip, and the portion of the polymeric layer is disposed around the solder bumps; and
   mounting the at least one chip on a circuit substrate so that solder bumps on the at least one chip are coupled to conductive regions on the circuit substrate.

24. The method of claim 1 wherein said release layer comprises material selected from the group consisting of a metal and a polymer.

25. The method of claim 1 wherein said release layer comprises a release layer selected from the group consisting of a metallic release layer and a polymeric release layer.

26. The method of claim 1 wherein said release layer has a melting temperature greater than about 250°.

27. The method of claim 1 wherein said release layer has a melting temperature greater than about 350°.

28. The method of claim 1 wherein said release layer has a melting temperature greater than about 450°.

29. The method of claim 13 wherein said release layer comprises material selected from the group consisting of a metal and a polymer.

30. The method of claim 13 wherein said release layer comprises a release layer selected from the group consisting of a metallic release layer and a polymeric release layer.

31. The method of claim 13 wherein said release layer has a melting temperature greater than about 250°.

32. The method of claim 13 wherein said release layer has a melting temperature greater than about 350°.

33. The method of claim 13 wherein said release layer has a melting temperature greater than about 450°.

* * * * *